(12) United States Patent
Hodos

(10) Patent No.: US 6,547,559 B1
(45) Date of Patent: Apr. 15, 2003

(54) CLAMPING OF A SEMICONDUCTOR SUBSTRATE FOR GAS-ASSISTED HEAT TRANSFER IN A VACUUM CHAMBER

(75) Inventor: Julian Hodos, Smithtown, NY (US)

(73) Assignee: Veeco Instruments, Inc., Woodbury, NY (US)

( * ) Notice: Subject to any disclaimer, the term of this patent is extended or adjusted under 35 U.S.C. 154(b) by 0 days.

(21) Appl. No.: 10/151,492

(22) Filed: May 20, 2002

(51) Int. Cl.[7] .............................................. B05C 13/00
(52) U.S. Cl. ......................... 432/253; 269/21; 269/287; 118/503
(58) Field of Search ................................ 432/253, 258, 432/259; 269/21, 287; 204/298.15; 29/25.01; 392/416, 418; 219/390, 405, 411; 118/503

(56) References Cited

U.S. PATENT DOCUMENTS

| | | | |
|---|---|---|---|
| 4,457,359 A | 7/1984 | Holden | 165/80 C |
| 4,508,161 A | 4/1985 | Holden | 165/1 |
| 4,512,391 A | 4/1985 | Harra | 165/48 R |
| 4,542,298 A | 9/1985 | Holden | 250/443.1 |
| 4,680,061 A | 7/1987 | Lamont, Jr. | 148/1.5 |
| 4,743,570 A | 5/1988 | Lamont, Jr. | 437/248 |
| 4,903,754 A | 2/1990 | Hirscher et al. | 165/1 |
| 4,909,314 A | 3/1990 | Lamont, Jr. | 165/80.3 |
| 4,949,783 A | 8/1990 | Lakios et al. | 165/80.1 |
| 5,513,594 A * | 5/1996 | McClanahan et al. | 118/503 |
| 5,534,110 A * | 7/1996 | Lenz et al. | 438/716 |
| 6,039,854 A * | 3/2000 | Liu | 204/298.11 |
| 6,440,219 B1 * | 3/2002 | Nguyen | 118/503 |

* cited by examiner

Primary Examiner—Gregory Wilson
(74) Attorney, Agent, or Firm—Wood, Herron & Evans, L.L.P.

(57) ABSTRACT

A method and apparatus are provided for supporting a semiconductor wafer in a vacuum and transferring heat by gas conduction between the wafer and a wafer chuck to facilitate wafer processing. The wafer substrate is loaded onto a seat plate, and then a clamp ring is lowered against the force of compression springs that bias the seat plate upward on guides extending upward from the body of the chuck. The clamp ring touches the wafer on the front or top side with an inner O-ring that is attached to the bottom of the clamp ring, and forces the wafer and the seat plate down to a lower position parallel to a heat transfer surface of the chuck, spaced therefrom by a narrow gap. In the lower position, an outer O-ring that is also attached to the bottom of the clamp contacts an outer sealing surface that surrounds the heat transfer surface, thereby enclosing a cavity that includes an annular chamber around the outside of the chuck and the narrow gap. Gas is supplied to the passage and thus to the gap. The gap and pressure may be such that a mean free path of the gas in the gap that is greater than the gap thickness, for example, 0.005 inches. Raising of the clamp ring allows the seat plate to raise to a transfer position to and from which a wafer is loaded or unloaded.

16 Claims, 2 Drawing Sheets

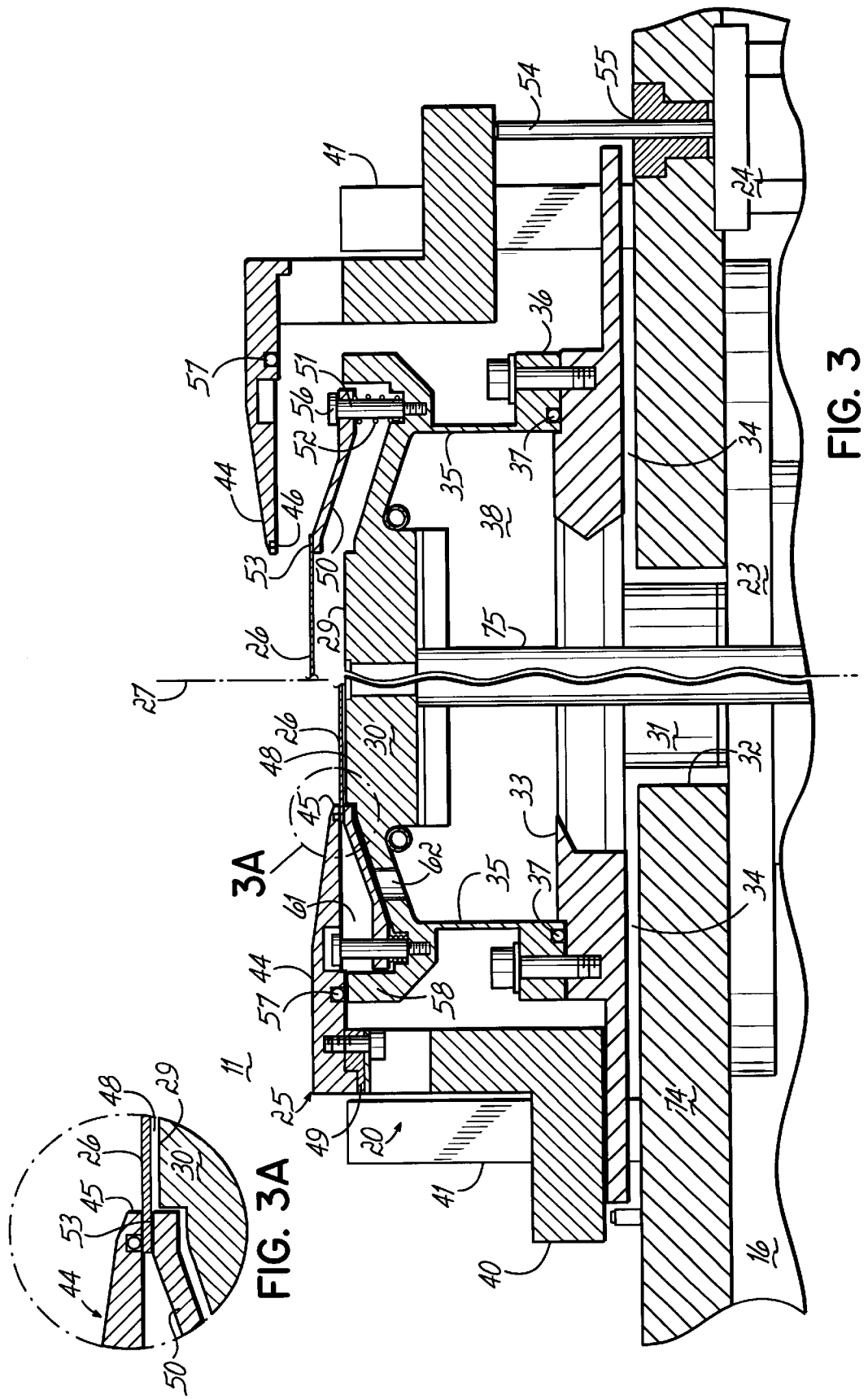

CLAMPING OF A SEMICONDUCTOR SUBSTRATE FOR GAS-ASSISTED HEAT TRANSFER IN A VACUUM CHAMBER

This invention relates to the supporting of semiconductor wafers for processing in a vacuum and particularly to the supporting of wafers, particularly relatively fragile wafers, for the transfer of heat to and from the wafers by gas conduction.

BACKGROUND OF THE INVENTION

Semiconductor wafers and other substrates that are supported in vacuum chambers for processing by processes such as reactive ion-etching (RIE), plasma etching, ion-beam etching, etching, ion-beam deposition, physical vapor deposition (PVD), chemical vapor deposition (CVD), and other processes. Applications using this type of equipment for example, are those set forth in *Thin Film Processes* (John L. Vossen and Werner Kern, eds), Academic Press Inc., Orlando, Fla., 1978; and *Thin Film Processes II* (John L. Vossen and Werner Kern, eds), Academic Press Inc., San Diego, Calif., 1991. In such applications, the substrates must usually be supported in a way that will facilitate the transfer of heat to or from the substrate. Usually it is also desirable to transfer the heat uniformly across the extent of the wafer.

It has been recognized that one effective way to heat and cool substrates in a vacuum chamber is by a process known as backside gas conduction. Backside gas conduction is a process by which heat is transferred between the wafer and a heat transfer body of a wafer supporting chuck by conduction of gas atoms or molecules between the body of the chuck and the wafer. Backside gas conduction takes place in a gas when the molecules of the gas, which leave one surface with heat energy acquired from that surface, arrive at the other surface without colliding with other molecules or particles when traversing the intervening space, thereby delivering energy to that other surface most efficiently. Most of the molecules of gas leaving one surface strike the other surface without in-flight collisions when the spacing of the surfaces is, by definition, less than the mean free path of particles in the gas. Backside gas conduction has been discussed in a number of U.S. patents, for example: in U.S. Pat. Nos. 4,457,359; 4,508,161; 4,512,391; 4,542,754; 4,680,061, 4,743,570; 4,903,754; 4,909,314 and 4,949,783. Other mechanisms of conducting heat to and from a substrate are also used, including gas convection and radiation.

Much of the focus of prior art efforts to provide heat transfer to and from a substrate has been on the manner of holding the substrate to the chuck in a way that holds the substrate to the chuck so that the most effective heat transfer occurs. As exemplified by the efforts used for backside gas conduction, holding the substrate close enough to the chuck to insure that heat transfer by gas conduction occurs has been the subject of much attention. Supporting the substrate for effective heat transfer has led to clamping solutions that have subjected the substrates to certain forces, which, when the substrate is a semiconductor wafer of relatively fragile characteristics, such as gallium arsenide wafers (GaAs) for example, can break or otherwise damage the wafer.

Further, gas leakage between the gap behind the wafer and the gas in the processing chamber can adversely affect the process, either by adversely, affecting the chemistry involved in the process or by entering the film on the substrate and degrading the product being formed on the substrate. In addition, where aggressive process gases or other harmful gases are involved in the process, these gases can contact the back of the wafer or components of the chuck, where reactions, deposits, electrical breakdowns or other damage to the wafer can occur. This has motivated the use of seals in forced contact with the wafer, and has resulted in further risk of damaging the wafers, particularly if they are of a fragile type.

Accordingly, better ways are needed for clamping semiconductor wafers with respect to a heat transfer surface to facilitate heat transfer between the wafer and the heat transfer surface in a vacuum processing chamber.

SUMMARY OF THE INVENTION

An objective of the present invention is to provide for the heating or cooling of semiconductor wafers and other substrates in a vacuum processing chamber, and particularly, to support such wafers, especially gallium arsenide and other fragile wafers, for heating or cooling in a vacuum. One particular objective of the invention is to support semiconductor wafers and other substrates in a vacuum for heating by backside gas conduction.

According to principles of the present invention, a substrate holder is provided with resilient structure to minimize localized forces on a wafer while being handled and supported in a vacuum processing chamber. According to other principles of the invention, the substrate holder is adapted to support the wafer at a predetermined distance from a heat transfer body of the substrate holder so as to facilitate heat transfer between the body and the wafer. The substrate holder so provided is particularly suited for exchange of heat with the wafer by backside gas conduction.

According to certain embodiments of the invention, resilient structure is provided: for engaging and moving a wafer between a wafer exchange position accessible to a transfer mechanism and a wafer processing position, and for forming a gas tight cavity that includes a narrow gap between the wafer and the heat transfer body that includes forming seals around the wafer and the heat transfer body.

In certain embodiments of the invention, a substrate support is provided in a vacuum processing chamber having a heat transfer body, a substrate seat member configured to resiliently support the semiconductor wafer by contacting the backside of the wafer around its edge, and a clamp ring that clamps the wafer to the substrate seat member, which may also be through resilient contact.

In an illustrated embodiment of the invention, the seat member is vertically moveable on guides attached to the heat transfer body and is biased away from the body by compression springs. The seat member normally rests away from the body in a wafer exchange position and moves, by force exerted against the front side of the wafer by the clamp ring, to a processing position spaced by a narrow gap from the heat transfer body.

Also in the illustrated embodiment, the clamp ring is vertically moveably supported on the chamber wall and is moved in guides by an actuator. The clamp ring stands away from the body and seat member to allow exchange of the wafer on the seat member and moves toward the body and contacts the wafer around its edge to force the wafer and seat member on which the wafer is supported downward against the force of the springs to the processing position. The clamp ring is supported and configured, relative to the heat transfer body, so as to precisely establish and maintain a desired thickness of the gap during processing. Such clamp rings support and configuration may be adjustable to accommodate different gap thicknesses.

According to certain embodiments of the invention, a resilient annular seal is positioned on the inner edge of the clamp ring to contact the wafer around its edge and form a gas tight cavity that includes the gap between the heat transfer body and the wafer when the seat member is forced to its lower processing position by the clamp ring.

Also according to the illustrated embodiments of the invention, the heat transfer body is provided with an upwardly facing heat transfer surface approximately corresponding in size to that of a semiconductor wafer to be processed, and may also be provided with an upwardly facing annular outer sealing surface that surrounds the heat transfer surface. The substrate seat member is configured to support an upwardly facing semiconductor wafer and move vertically between i) an upper wafer exchange position under the force of compression springs and ii) a lower processing position spaced by the narrow gap from the heat transfer surface under force of the clamp ring acting against the force of the compression springs. The clamp ring may have the annular seal on the wafer side of its inner edge adapted to contact and form a gas tight seal against the frontside of the wafer. In addition, an annular outer seal may be provided between the outer sealing surface of the heat transfer body and the clamp ring that forms an annular channel within the cavity in communication with the gap when the seat member is in its lower processing position.

The substrate support may be incorporated into semiconductor wafer vacuum processing machines that have control systems that control the pressure of gas within the gap such that the mean free path of particles of the gas is greater than the thickness of the gap, thereby efficiently facilitating transfer of heat between the heat transfer body and the surface of the wafer by gas conduction.

The invention allows for gentle handling of fragile wafers, for example, gallium arsenide wafers that are particularly brittle. Contact of the wafer by the clamp ring through a resilient seal and support of the seat plate on compression springs contribute to this capability. Gas from the chamber is isolated from the backside of the wafer, avoiding harmful deposits on the backside of the wafer or substrate support surface. Further, when a seal is made with the frontside of the wafer, higher pressure in the gap than in the chamber results in force on the wafer that presses the wafer against the seal.

These and other objectives and advantages of the present invention will be more readily apparent from the following detailed description, in which:

BRIEF DESCRIPTION OF THE DRAWINGS

FIG. 3 is a side cross-sectional view along line 3—3 of FIG. 2, split along its vertical centerline, illustrating (on the left) the wafer clamp of the support in its clamped position and illustrating (on the right) the wafer clamp of the support in its unclamped position.

FIG. 3A is an enlarged view of the portion of FIG. 3 indicated by the circle 3A.

DETAILED DESCRIPTION OF THE DRAWINGS

Figure 1:
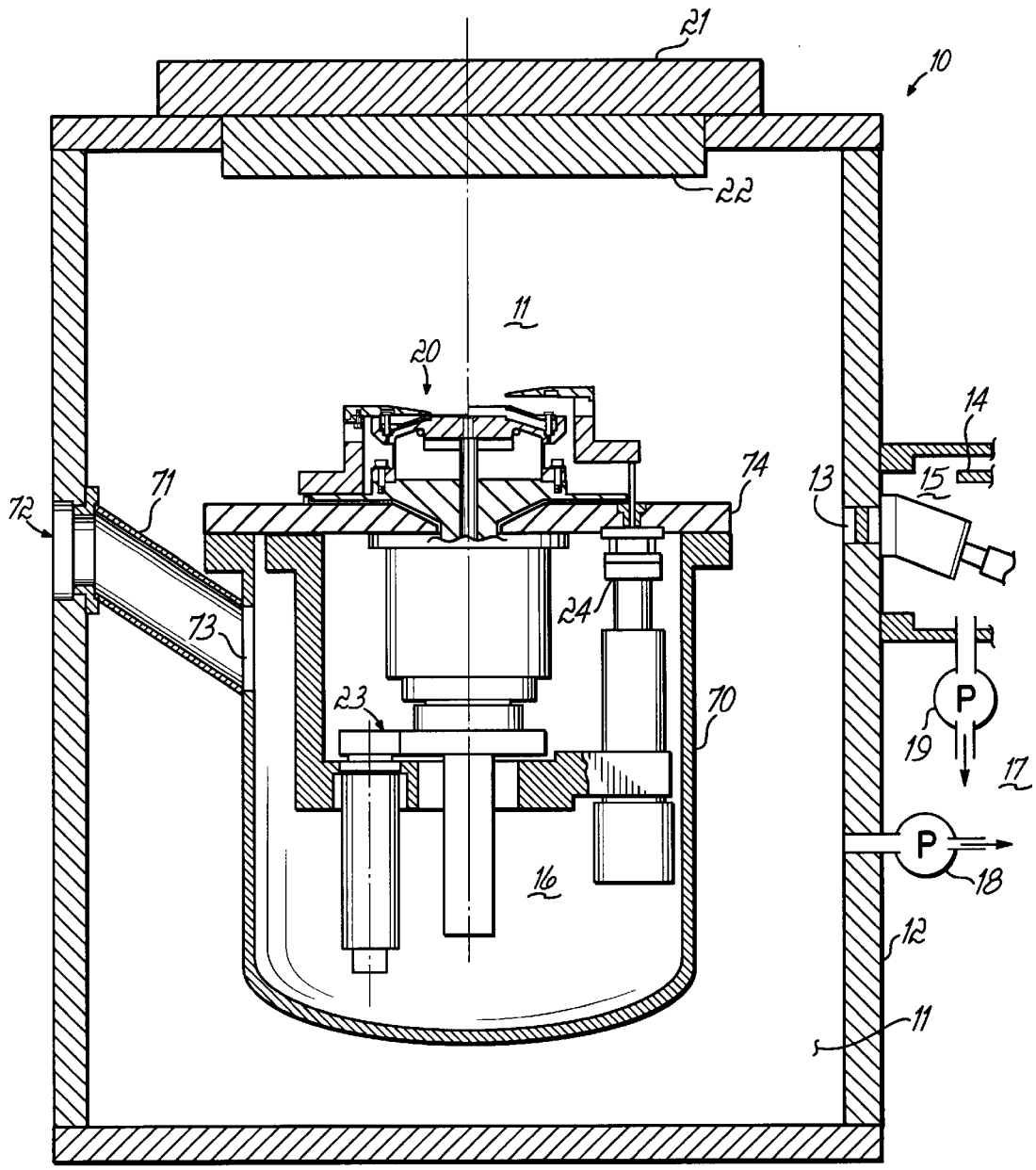
FIG. 1 is a diagrammatic view of a semiconductor wafer processing apparatus embodying the present invention.

FIG. 1 is a diagrammatic representation of a semiconductor wafer processing apparatus 10 that includes a vacuum processing chamber 11 contained within a vacuum tight chamber wall 12. The wall 12 has a gate 13 therein through which semiconductor wafers are loaded into the chamber 11 for processing and removed by a transfer device 14 in a transfer chamber 15 adjacent the processing chamber 11. Both of the chambers 11 and 15 are maintained during operation at vacuum pressure levels by vacuum pumps 18 and 19 respectively. Gas supply systems (not shown) connect to each of the chambers 11 and 15 to provide processing gas.

A fixture chamber 16 is surrounded by a vacuum tight fixture chamber wall 70 that is supported at the center of the processing chamber 11 by a hollow access tube 71 fixed to the chamber wall 12. An opening 72 in the chamber wall 12 provides access to the access tube 71 from outside of the chamber 11 and communicates ambient atmosphere from the room 17 in which the apparatus 10 is situated. The inside of the fixture chamber 16 communicates with the tube 71 through an opening 73 in the fixture chamber wall 70, thereby maintaining the fixture chamber 16 at atmospheric pressure. A fixture top plate 74 is sealed to the opening at the top of the fixture chamber wall 70 to enclose the fixture chamber 16.

The chamber 11 typically has a substrate support or chuck 20 therein, shown supported in the chamber 11, upwardly facing from the top of the fixture top plate 74. The chuck 20 supports a semiconductor wafer for processing in the chamber 11. Such processing is most commonly, although not exclusively, a coating or etching process, or a thermal or plasma treatment process, or combination of these processes. The chuck 20 faces toward a processing medium source 21 located across the chamber 11 from the support 20, shown at the top of the chamber 11. For deposition processes, the source 21 may include a coating material source 22, such as a sputtering target, which is used for sputter or physical vapor deposition, or such as a showerhead or other gas inlet device, which is used for chemical vapor deposition.

The conditions of the chuck 20 are maintained by a conventional table drive and control assembly 23 located in the fixture chamber 16. The table drive and control assembly 23 may include, for example, an elevator that raises and lowers the chuck 20 and determines the vertical position of the substrate for processing, all as well known in the field. The assembly 23 may also contain a substrate support heating and cooling system and other controls for maintaining processing parameters on the substrate and for handling the substrate, as are also well known. A table clamp actuator 24 is also contained in the fixture chamber 16 for operating the clamping structure (described below) that holds a semiconductor wafer substrate in position on the chuck 20 for processing in the chamber 11.

Figure 2:
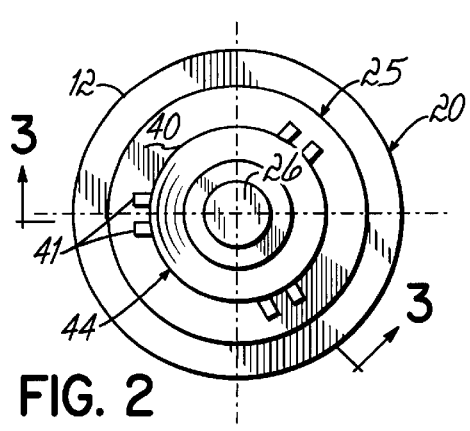
FIG. 2 is a top cross-sectional view along the line 2—2 of FIG. 3 illustrating in particular the semi conductor wafer support.

An annular clamp assembly 25 is provided to hold a wafer 26 to the chuck 20, as illustrated in FIG. 2. The clamp assembly 25 holds a semiconductor wafer 26 in an upwardly-facing horizontal orientation on the approximate vertical centerline 27 of the chamber 11, where the wafer 26 is centered over a heat transfer body 30 of the chuck 20, as illustrated in FIG. 3. The heat transfer body 30 has an upper heat transfer surface 29 that is approximately the size of the semiconductor wafer 26.

A table drive and control assembly 23 has a vertically-extending shaft 31 that extends through a hole 32 in the top plate 74 of the fixture chamber 16 and into the chamber 11. A support table base plate 33 extends around the hole 32 on top of the fixture table top plate 74. The heat transfer body 30 has electrical resistance heating elements embedded therein (not shown) or some other system connected thereto, which may be any of several conventional types. The body 30 is formed of a thermally conductive material at the upper end of a hollow thin-walled cylindrical support tube 35. The tube 35 has a mounting flange 36 at the lower end thereof that is bolted to the top of the base plate 33, to which it forms a vacuum seal via an O-ring 37, to isolate an interior chuck volume 38 from the vacuum of the chamber 11. The interior chuck volume 38 has a controlled atmosphere applied to it through a passage (not shown) in the shaft 31.

The clamp assembly 25 includes an annular housing 40 that surrounds and is concentric with the heat transfer body 30 and which is vertically moveable on guides 41.

A clamp ring 44 is fixed to the top of the housing 40 and has an inner circular edge 45 having an inner O-ring seal 46 on the lower side thereof to form a seal with the upper surface of the wafer 26 around its edge. The body 30, the housing 40 and the clamp 44 are dimensioned such that a wafer 26, which is sealed against the O-ring 46 on the lower side of the edge 45 of the clamp 44, is parallel to and spaced from the top surface of the body 30, defining a narrow gap 48 between the wafer and the top of the heat transfer body 30 at a predetermined distance that is, for example, approximately 0.005 inches, as illustrated in FIG. 3A. The thickness of the gap 48 is determined by the combined geometry of the housing 40 and the clamp ring 44, and can be varied by exchanging spacing rings 49 of different thicknesses, or otherwise adjusting this combined geometry.

The wafer 26 is held above the heat transfer body 30 on a seat plate 50 that slides on vertical guides 51 fixed to the top of the body 30 around its perimeter. The seat plate 50 has a circular opening surrounded by an inner rim 53 on the upper surface of which the wafer 26 is supported for processing. The seat plate 50 is biased upwardly by coil springs 52 that surround each of the guides 51. While the seat plate 50 that is illustrated has a circular inner rim 53 that supports the wafer 26 along a continuous area around the edge of the wafer 26, the plate 50 could be provided with a plurality of tabs that extend radially inwardly to support the wafer 26 at at least three angularly spaced points around the wafer edge.

The clamp assembly 25 is lifted from its lowered position to a raised position, as shown on the right side of FIG. 3, by vertically moveable lift pins 54, which extend vertically through holes 55 in the bottom of the chamber wall 11 and are raised by operation of the actuator 24. In the illustrated embodiment, lift pins 54 are three in number and equally spaced at 120° angles around the axis 27 of the chamber 11. When the clamp assembly 25 is in its raised position, it moves out of contact with the seat plate 44 and allows the seat plate 44 to move upward under the force of springs 52 to a stop 56 at the top ends of the guides 51. This positions the seat plate 50 for placement thereon of a wafer 26 by the transfer device 14.

Operation of the actuator 24 to lower the pins 54 moves the clamp ring 44 downwardly to bring the seal 46 against the rim of the wafer 26 which presses the seat plate 40 down to its lowered position (FIG. 3A) An outer O-ring seal 57 is provided on the underside of the clamp ring 44, which forms a seal between the clamp ring 44 and an outwardly and upwardly extending rim 58 of the heat transfer body 30 (FIG. 3), thereby forming a stop that defines the lowered position (FIG. 3A) of the clamp ring assembly 25. This precisely fixes the relative position of the clamp assembly 25 to the heat transfer body 30 when the clamp assembly is in the lowered position and precisely locating the wafer 26 relative to the heat transfer surface 29. In this position, an enclosed compartment 60 is formed, which is sealed from the chamber 11, that includes an annular cavity 61 between the clamp 44 and the seat plate 50 and the gap 48 between the wafer 26 and the top of the heat transfer body 30.

In operation, with the clamp assembly 25 in its raised position (right side of FIG. 3), a wafer 26 is loaded by the transfer device 14 through the gate 13 and into the chamber 11, onto the inner rim 53 of the seat plate 50. Then the clamp assembly 25 is lowered to bring the clamp 44 down until the inner O-ring seal 46 touches the top surface of the wafer 26 and then brings the wafer 26 and seat plate 50 against the force of the compression springs 52 to its lower position (left side of FIG. 3) where the outer O-ring seal 57 is in contact with the rim 58 of the body 30, spacing the wafer 26 the predetermined distance from the heat transfer body 30. This forms and maintains the gap 48 between the wafer 26 and the top surface of the body 30. Pressurized gas from the volume 38 flows from a conduit 75 through a central passage in the heat transfer body 30 and into the gap 48, and re-circulates through a passage 62 in the body 30 to an exhaust conduit (not shown). In this embodiment, a seal is formed indirectly between the wafer and the heat transfer body through the inner and outer seals and the clamp ring.

The relationship between the thickness of the gap 48 and the pressure of gas in the gap 48 may be such that the gas in the gap 48 facilitates the transfer of heat between the heat transfer body 30 of the chuck 20 and the wafer 26, predominantly by gas conduction, that is, with most of the heat transfer being by gas conduction rather than gas convection or radiation. With the thickness of the gap 48 at about 0.005 inches (approximately ⅛th millimeter), the mean free path of gas in the gap 48 is at least as great as the gap thickness for pressures up to about 1 Torr. Where the thickness of the gap 48 is less than the mean free path of molecules of the gas, heat transfer between the body 30 and the wafer 26 occurs substantially more by gas conduction than by gas convection or radiation. Where the average distance traveled by gas particles is less than their mean free path, more than half of those particles pass between the opposing surfaces without colliding with other particles, and hence convey heat by gas conduction. Other gap thicknesses may be maintained and may be useful for heat transfer to occur predominantly by other than gas conduction.

Gas conduction occurs when a molecule or atom of gas that leaves the surface of the body 30 strikes the back side of the wafer 26 without striking another molecule or atom when crossing the gap 48. When the gap thickness is less than about 80–85% of the mean free path of the gas (which takes into account that the gas atoms do not necessarily all move perpendicular to the opposed surfaces) at least half of the gas molecules or atoms traverse the gap 48 without in-transit collisions. The gap thickness may be equal to or less than the mean free path of the gas at the pressure of gas within the gap, and may be less than the thickness needed for about half or more of the gas atoms or molecules to traverse the gap 48 without colliding in transit with another gas atom or molecule or other particle. Accordingly, where pressures lower than 1 Torr are expected to be present in the gas in the gap 48, greater spacing between the wafer 26 and the body 30 may be used. For example, at 100 mTorr of pressure in the gap 48, the mean free path of the gas is about 0.02 inches (approximately 0.5 mm); at 10 mTorr, about 0.2 inches (approximately 5 mm); and at 1 mTorr, about 2 inches (approximately 55 mm). However, at lower pressures where the density of the gas is low, the capacity of the gas to conduct thermal energy is proportionally less.

In addition, to the extent that the pressure of gas within the gap 48 is greater than the pressure within the chamber 11, the wafer 26 is pressed against the seal 46 rather than away from the seal if the seal were between the back side of the wafer 26 and the seat plate 50 or the heat transfer body 30. To the extent practical, the pressure of the gas in the gap 48 can be maintained at a pressure that is not much greater than the pressure in the chamber 11, particularly for larger wafers, for example, 300 mm or 200 mm wafers, or for very fragile wafers, for example, gallium arsenide wafers. In some embodiments, it may be acceptable to locate the seal 46 on the seat member to contact the backside of the wafer, particularly if the pressure in the chamber is higher than that behind the wafer. In this case, a seal would be formed directly between the wafer and the heat transfer body. In such a case, the gas passage 62 would communicate directly with the gap 48.

Further, the gentle handling of fragile wafers is provided by placing the wafer on the seat plate 50 that is supported by springs 52, which limits the force that is exerted on the wafer and avoids concentrated forces that frequently result when placing a wafer directly onto a rigid support. The contact of the clamp ring 44 with the top of the wafer through the resilient O-ring 46 also avoids subjecting fragile wafers to concentrated loads.

Those skilled in the art will appreciate that the application of the present invention herein is varied, that the invention is described in preferred embodiments, and that additions and modifications can be made without departing from the principles of the invention. Therefore, the following is claimed:

What is claimed is:

1. An apparatus for supporting a semiconductor wafer for vacuum processing comprising:
   a heat transfer body having an upwardly facing heat transfer surface approximately corresponding in size to that of a semiconductor wafer to be processed, and an upwardly facing annular outer sealing surface;
   a substrate seat member configured to support an upwardly facing semiconductor wafer to be processed thereon by contacting the backside of the wafer around its edge, the seat member being attached to the heat transfer body so as to move vertically thereon between a lower processing position spaced by a narrow gap from the heat transfer surface and an upper wafer exchange position, the seat member being resiliently biased toward the upper wafer exchange position;
   an inner seal adapted to contact and form a gas tight seal against the wafer around the edge of the wafer;
   a clamp ring vertically moveably supported above the substrate seat member adapted to contact the frontside of the wafer around the edge thereof and to force the wafer and seat member downward against the resilient bias to the lower processing position of the seat member and to form a gas tight seal between the wafer and the inner seal;
   an annular outer seal between the outer sealing surface of the heat transfer body and the clamp ring positioned to form a gas seal between the annular outer sealing surface and the clamp ring when the seat member is forced to its lower processing position by the clamp ring;
   the heat transfer body, the clamp ring and the seals enclosing a gas tight cavity that includes the gap.

2. The apparatus of claim 1 wherein:
   a clamp ring has the inner seal located thereon and adapted to contact and form the gas tight seal against the frontside of the wafer around the edge and to force the wafer and seat member downward by force exerted through the inner seal.

3. The apparatus of claim 1 further comprising:
   a gas source connected to the cavity for supplying gas to the gap under conditions effective for transferring heat between the heat transfer body and the wafer predominantly by gas conduction.

4. The apparatus of claim 1 further comprising:
   a heater for heating the heat transfer body; and
   a gas supply connected to the cavity;
   the gap having a thickness not greater than approximately the mean free path of the gas in the cavity.

5. The apparatus of claim 1 further comprising:
   a heater embedded in the heat transfer body.

6. The apparatus of claim 1 further comprising:
   guides fixed to and extending upwardly from the heat transfer body, the substrate seat member being slidably mounted on the guides; and
   compression springs between the heat transfer body and the substrate seat member biasing the member upwardly to the upper wafer exchange position.

7. An apparatus for processing a semiconductor wafer in a vacuum comprising:
   a processing chamber;
   a control system operable to maintain a vacuum of a processing gas in the processing chamber;
   a substrate support mounted in the processing chamber and including:
     a heat transfer body having an upwardly facing heat transfer surface,
     a substrate seat member configured to support an upwardly facing semiconductor wafer to be processed thereon by contacting the backside of the wafer around its edge, the seat member being attached to the heat transfer body so as to move vertically thereon between a lower processing position spaced by a gap from the heat transfer surface and an upper wafer exchange position, the seat member being resiliently biased toward the upper wafer exchange position;
     a clamp ring vertically moveably supported in the chamber above the substrate seat member and adapted to contact the wafer around the edge and to force the wafer and seat member downward against the resilient bias to the lower processing position of the seat member; and
     a seal positioned to contact the wafer around its edge and form a gas tight cavity that includes the gap between the heat transfer body and the wafer when the seat member is forced to its lower processing position by the clamp ring.

8. The apparatus of claim 7 wherein:
   the heat transfer body has a heat transfer surface and an upwardly facing annular outer sealing surface surrounding the heat transfer surface;
   the seal is an inner seal attached to the clamp ring and adapted to contact and form a gas tight seal against the frontside of the wafer around the edge, and
   the apparatus includes an annular outer seal positioned between the clamp ring and the heat transfer body to form a gas seal therebetween when the seat member is forced to its lower processing position by the clamp ring.

9. The apparatus of claim 8 wherein:
   the heat transfer body has an upwardly facing annular outer sealing surface; and the clamp ring has the inner seal attached thereto and positioned to contact the frontside of the wafer when the seat member is forced to its lower processing position by the clamp ring and has the annular outer seal attached thereto and positioned to contact the outer sealing surface of the heat transfer body when the seat member is forced to its lower processing position by the clamp ring; and the heat transfer body, the clamp ring and the seals enclosing a gas tight cavity that includes the gap when the seat member is forced to its lower processing position by the clamp ring.

10. The apparatus of claim 8 wherein:

the heat transfer body has an upwardly facing annular outer sealing surface; and the clamp ring has the inner seal attached thereto and positioned to contact the frontside of the wafer when the seat member is forced to its lower processing position by the clamp ring; and the heat transfer body, the clamp ring and the seals enclosing a gas tight cavity that includes the gap when the seat member is forced to its lower processing position by the clamp ring.

11. A method of supporting a semiconductor wafer for vacuum processing comprising:

resiliently maintaining a seat member biased toward an upper wafer exchange position above a heat transfer body having an upwardly facing heat transfer surface;

placing a semiconductor wafer, with a surface thereof to be processed facing upwardly, on the substrate seat member when in the upper wafer exchange position and supporting the wafer by contacting the backside of the wafer around its edge by the seat member;

moving a clamp ring from above the substrate seat member vertically downward, contacting, with an inner seal, the wafer around its edge and forcing, with the clamp ring, the wafer and seat member downward against the resilient upward bias applied to the seat member, to a lower processing position of the seat member in which the wafer is spaced by a narrow gap above the upwardly facing heat transfer surface of the heat transfer body; and forming a seal between the heat transfer body and the wafer when the seat member is forced to its lower processing position by the clamp ring and forming thereby a cavity that at least includes the gap.

12. The method of claim 11 wherein:

the upwardly facing heat transfer surface of the heat transfer body approximately corresponds in size to that of a semiconductor wafer; and the moving of the clamp ring and forcing of the wafer and seat member to a lower processing position locates the wafer parallel to and aligned with the upwardly facing heat transfer surface of the heat transfer body and defines the gap therebetween.

13. The method of claim 11 further comprising:

providing an outer sealing surface on the heat transfer body having a larger diameter than that of the wafer; and the forming of the seal between the heat transfer body and the wafer including forming a seal between the outer sealing surface and the clamp ring.

14. The method of claim 11 further comprising:

supplying gas to the gap under conditions effective for transferring heat between the heat transfer body and the wafer predominantly by gas conduction.

15. The method of claim 11 further comprising:

maintaining gas in the cavity at a pressure that is effective to enable the gas to transfer heat across the gap between the heat transfer body and the backside of the wafer under conditions effective for transferring heat between the heat transfer body and the wafer predominantly by gas conduction.

16. The method of claim 11 further comprising:

heating the heat transfer body; and supporting the wafer a distance not greater than approximately the mean free path of the gas in the gap when the seat member is in the lower processing position.

* * * * *

UNITED STATES PATENT AND TRADEMARK OFFICE
CERTIFICATE OF CORRECTION

PATENT NO.       : 6,547,559 B1
DATED            : May 20, 2002
INVENTOR(S)      : Hodos It is certified that error appears in the above-identified patent and that said Letters Patent is hereby corrected as shown below:

Column 1,
Line 45, "4,680,061," and should read -- 4,680,061; --.

Column 3,
Line 52, "FIG. 3 illustrating in particular the semi conductor wafer" and should read -- FIG. 1 illustrating in particular the semiconductor wafer --.

Column 4,
Line 67, "or some other system" and should read -- or some other heating or temperature determining system --.

Column 5,
Line 58, "(FIG. 3A) An outer" and should read -- (FIG. 3A). An outer --.

Column 8,
Line 59, "edge, and" should read -- edge; and --.

Signed and Sealed this

Sixth Day of January, 2004

JAMES E. ROGAN
*Director of the United States Patent and Trademark Office*